(12) United States Patent
Joffe et al.

(10) Patent No.: US 7,116,256 B1
(45) Date of Patent: Oct. 3, 2006

(54) PULSE SHAPING APPARATUS AND METHOD

(75) Inventors: Daniel M. Joffe, Owens Crossroads, AL (US); Paul C. Ferguson, Harvest, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 11/204,506

(22) Filed: Aug. 16, 2005

(51) Int. Cl.
    *H03M 1/66* (2006.01)
(52) U.S. Cl. .............. 341/144; 710/305; 375/238
(58) Field of Classification Search ........... 341/144, 341/152; 710/305, 313; 375/219, 238, 239
    See application file for complete search history.

(56) References Cited

U.S. PATENT DOCUMENTS

| | | | |
|---|---|---|---|
| 4,403,193 A * | 9/1983 | Takemura | 327/4 |
| 5,644,734 A * | 7/1997 | Hong | 710/305 |
| 6,421,390 B1 | 7/2002 | Burkhart | 375/355 |
| 6,611,567 B1 | 8/2003 | Balakrishnan et al. | 333/20 |
| 6,627,879 B1 | 9/2003 | Reilly et al. | 375/355 |
| 6,658,053 B1 | 12/2003 | Aiello et al. | 360/20 |
| 6,731,691 B1 | 5/2004 | Agazzi et al. | 375/224 |
| 6,760,179 B1 | 7/2004 | Moon et al. | 375/285 |
| 6,771,725 B1 | 8/2004 | Agazzi et al. | 325/287 |
| 6,844,791 B1 | 1/2005 | Jordanov | 375/298 |
| 6,873,586 B1 * | 3/2005 | Yamaguchi et al. | 369/53.26 |
| 6,917,657 B1 | 7/2005 | McCarty, Jr. | 375/355 |

* cited by examiner

*Primary Examiner*—Peguy JeanPierre
(74) *Attorney, Agent, or Firm*—Thomas, Kayden, Horstemeyer, & Risley, L.L.P.

(57) ABSTRACT

A system has a first digital-to-analog (D/A) converter to receive a digital signal and to convert the digital signal into an analog pulse, a second D/A converter to cancel residual energy resulting from a previous pulse if a predetermined sequence of digital data is received, and a third D/A converter to control a falling edge of the analog pulse. Additionally, the system has logic to detect the sequence of digital data and to generate control data for at least one of the D/A converters from the digital data sequence thereby ensuring that the analog signal complies with the specified pulse mask template.

18 Claims, 8 Drawing Sheets

PULSE SHAPING APPARATUS AND METHOD

RELATED ART

ANSI T102.1993 specifies a pulse template that provides for an upper and lower signal boundary between which a DS3-compliant transceiver is to transmit a signal. FIG. 1 depicts the DS3 pulse template 100 of such a standard. The pulse template 100 comprises an upper boundary 102 and a lower boundary 104. In order for a transceiver to be DS3 compliant, a signal transmitted by the transceiver must fall between the mandated upper boundary 102 and lower boundary 104.

The pulse template 100 generally exhibits four pulse characteristics, including, the height, rise time, fall time and "front porch" of the pulse. The front porch of the pulse template 100 is the narrow portion 106 that allows for the least deviation in amplitude during the pulse cycle. In designing devices that comply with the pulse template 100, the front porch 106 is difficult to meet in certain circumstances.

The pulse mask template specifications of FIG. 1 generally apply to communication equipment used in a central office. In this regard, FIG. 2 depicts a central office (CO) 200 of a communication network 214. The central office 200 comprises a plurality of equipment bays 201 and 205. Each equipment bay 201 and 205 comprises a plurality of adjustable pulse transceivers 202–204 and 206–208, respectively, that are communicatively coupled to various customer premises equipment (CPE) (not shown) and/or other CO equipment (not shown) via a plurality of subscriber lines 212 or central office connections 211. The central office 200 further comprises a digital cross-connect system (DCS) 209 that is communicatively coupled to each of the transceivers 202–204 and 206–208 via communication lines 220.

In operation, one of the transceivers 202–204 receives a signal via its corresponding subscriber line 212. This transceiver 202–204 transmits the signal to the DCS 209. The DCS 209 maps this signal to the appropriate central office transceiver 206–208 such that the appropriate CO equipment receives the signal. Also, one of the transceivers 206–208 receives a signal via its corresponding central office connection 211. This transceiver 206–208 transmits the signal to the DCS 209. The DCS 209 maps this signal to the appropriate customer premises transceiver 202–204 such that the signal is received by the appropriate CPE via its corresponding subscriber line 212.

In order for a transmitting transceiver 202–204 or 206–208 to be DS3 compliant, it must transmit a signal that complies with the pulse template in FIG. 1 when received by the DCS 209 during transmission from one equipment bay 201 and/or 205 to another. As illustrated, however, one equipment bay 201 may be located relatively close to the DCS 209 as compared to another bay 205, and the pulses transmitted from the bay 201 located further from the DCS 209 experience greater attenuation before reaching the DCS 209.

Therefore, even if each of the transceivers 202–204 and 206–208 is configured to transmit the same pulse, it is possible for some of the transmitting transceivers 202–204 and 206–208 to be DS3 compliant while others are not. For example, if the bay 201 is located significantly further from the DCS 209 as compared to the bay 205, it is possible for the transceivers 206–208 to be DS3 compliant while the transmitting transceivers 202–204 are non-compliant and vice versa. In addition to the attenuation of the pulses, there is a smearing effect that is dependent on the length of the transmission medium. For sufficiently long cables, the smearing effect creates a tail on the pulse that is long enough to be present during the next several pulses, thereby affecting their shape. This effect is defined as inter-symbol interference, and can be great enough to cause a failure of the pulse mask test.

In order to account for differences in cable lengths, the transmitting transceivers 202–204 and 206–208 are often adjustable, such that each transceiver 202–204 or 206–208 can transmit a different pulse. Thus, by individually adjusting each transmitting transceiver 202–208 or 206–208 depending on its distance from the DCS 209, it is possible to configure each transceiver 202–204 and 206–208 to be DS3 compliant even if the distances of the bays 201 and 205 from the DCS 209 are significantly different. Transceivers often transmit one pulse shape that is compliant for short cables, and a second pulse that is compliant for long cables. Thus upon installation, a technician must estimate the cable length and select the appropriate setting. Deployment costs could be reduced by the use of transceiver capable of transmitting a universal pulse that could meet the pulse mask test for any length of cable.

SUMMARY OF THE DISCLOSURE

Generally, the present disclosure provides devices and methods for receiving digital data and transmitting analog signals associated with the received digital data to another device. Specifically, a device and method of one embodiment of the present disclosure generates a pulse that complies with a specified standard despite a wide range of possible lengths of the medium on which the pulse is transmitted.

A system in accordance with an embodiment of the present disclosure comprises a first digital-to-analog (D/A) converter configured to receive a digital signal and to convert the digital signal into an analog pulse, a second D/A converter configured to cancel residual energy resulting from a previous pulse if a predetermined sequence of digital data is received, and a third D/A converter configured to control a falling edge of the analog pulse. Additionally, the system comprises logic configured to detect the sequence of digital data and to generate control data for at least one of the D/A converters from the digital data sequence thereby ensuring that the analog signal complies with the specified pulse mask template.

A method in accordance with an embodiment of the present disclosure comprises the steps of receiving a digital signal and converting the received digital signal into an analog signal, if the analog signal comprises an isolated pulse defined by a particular sequence of digital data in the digital signal, the isolated pulse having a main body portion and a leading edge portion. The method further comprises the steps of detecting the sequence of digital data, generating the main body portion in response to the particular sequence of digital data, and generating the leading edge portion in response to the particular sequence of digital data separate from the step of generating the main body portion. Additionally, the method comprises sequentially combining the main body and the leading edge portions.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
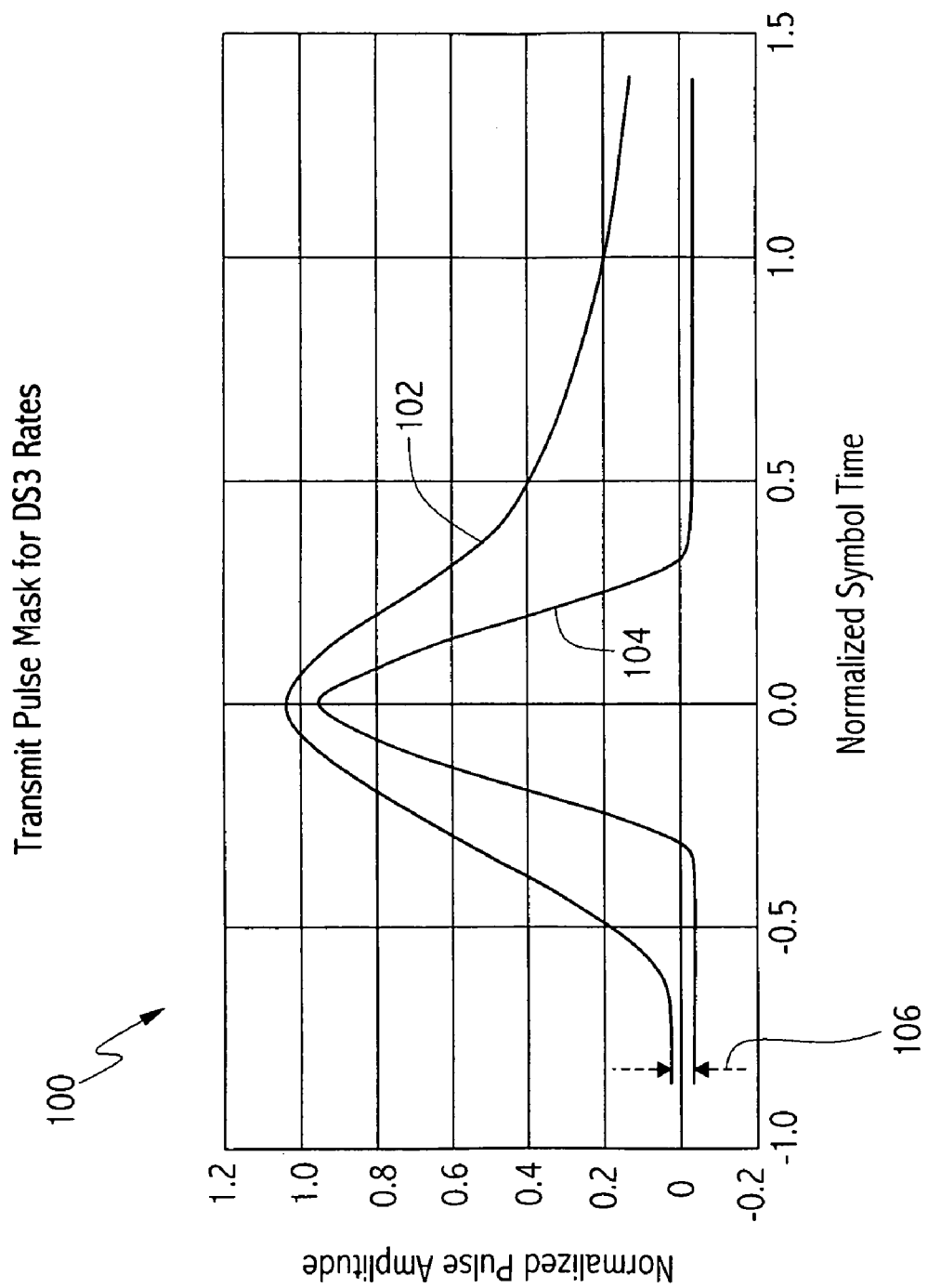
FIG. 1 is a block diagram illustrating a pulse mask template for testing whether a pulse is DS3 compliant.
Figure 2:
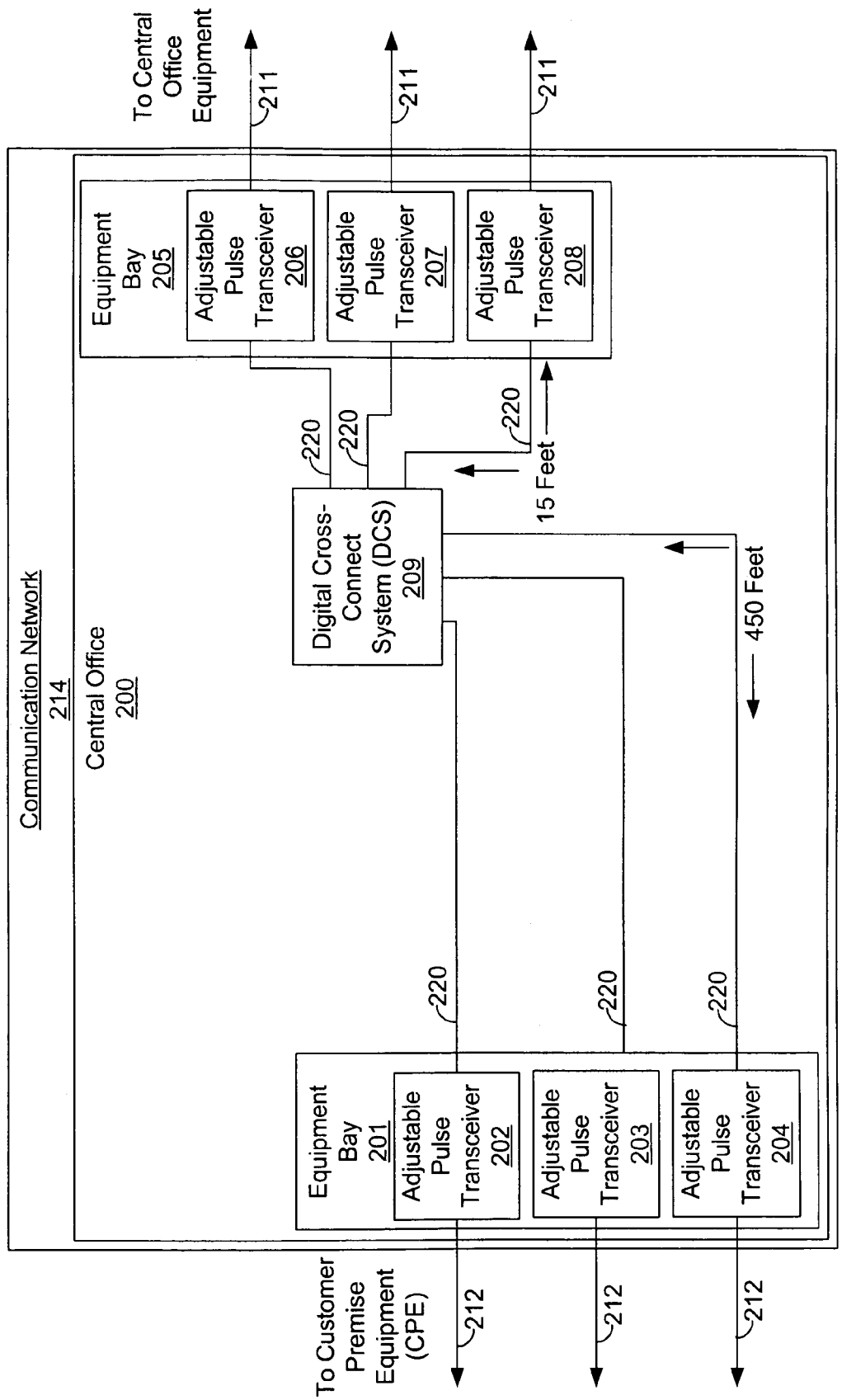
FIG. 2 is a block diagram illustrating a central office employing a plurality of conventionally adjustable transceivers.

Embodiments of the present disclosure generally pertain to devices and methods for transmitting analog pulses within a desired tolerance. In particular, a data transmission device of the present disclosure transmits an analog pulse, hereinafter referred to as a "compliant pulse," that falls within a desired tolerance for cables having a length of zero feet through at least four hundred and fifty feet between the data transmission device and a point of test. In this regard, the data transmission device transmits a compliant pulse that conforms to the desired tolerance if the compliant pulse is tested at zero feet of cable, i.e., at the point when the compliant pulse leaves the device. Likewise, the compliant pulse conforms to the desired tolerance if tested after traveling across a four hundred and fifty-foot cable. Thus, the data transmission device transmits a compliant pulse that conforms to the desired tolerance for a large range of possible cable lengths between the device and a point of test. Consequently, the compliant pulse received at the point of test meets pulse template characteristics for a particular communication specification, e.g., DS3, STS-1, at any point along the cable length, up to at least four hundred and fifty feet, through which the pulse travels.

In order to verify that a transmitted pulse is compliant to the pulse mask, it is necessary to view an isolated pulse, meaning a pulse that is free from inter-symbol interference. DS3 data transmission, however, uses a coding scheme that insures that there are never more than two zeros in a row. So the most isolated pulse that can be achieved is one that is preceded by two zeros, then followed by two zeros. In verifying pulse mask compliance, it is common to use a "100" pattern to create a repeating stream of "isolated" pulses that can be viewed and measured for compliance. The "100" pattern is actually a repeating digital string "(+1)00 (−1)00." Any time a 100 sequence is transmitted, the following negative pulse (−1) is considered to be isolated, so a pulse mask test may be performed. Alternately, any time a −100 sequence is transmitted, the following positive pulse (+1) is considered to be isolated, so a pulse mask test may be performed.

Upon receipt of the test sequence, the transceiver generates a compliant pulse that will meet a specified pulse mask template for cable lengths of various lengths from zero to at least four hundred and fifty feet. In order to generate the compliant pulse, the transceiver employs a set of digital-to-analog converters (DACs), and each DAC generates a smaller pulse that makes up a portion of the compliant pulse. One of the pulses, hereinafter referred to as the "leading edge pulse," generated by one of the DACs is used to define the leading edge of the compliant pulse. The leading edge pulse generated ensures that the front porch of the eventual compliant pulse transmitted from the transceiver is within the limits prescribed by a pulse mask template corresponding to the relevant digital signal standard, e.g., DS3, STS-1. The compliant pulse generated meets the pulse mask template both at the point of transmission from the receiver and at any point along a communication line, up to at least four hundred and fifty feet.

Figure 3:
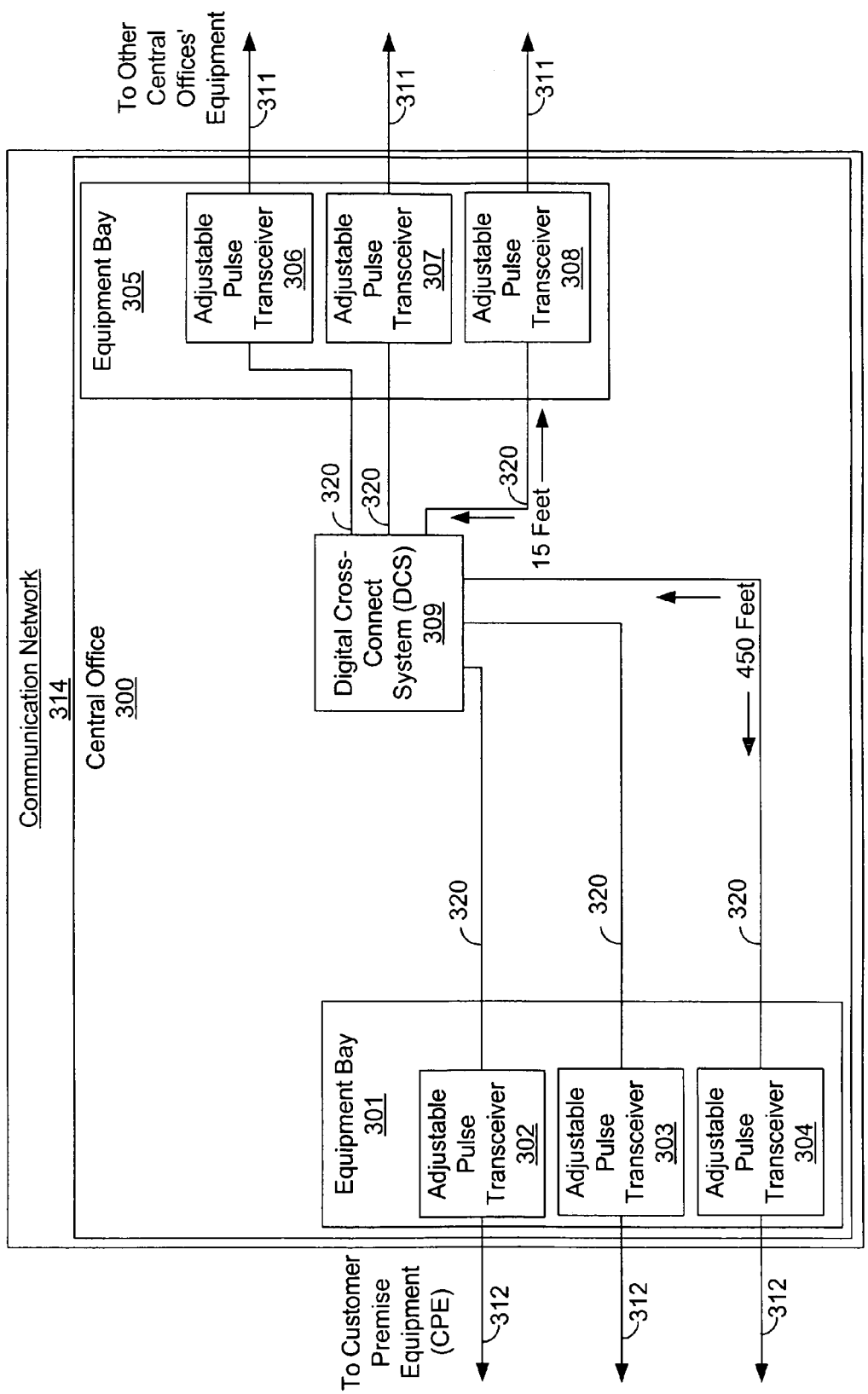
FIG. 3 is a block diagram illustrating a central office employing a plurality of transceivers in accordance with an embodiment of the present disclosure.

FIG. 3 is a block diagram illustrating a communication network 314 having a central office 300 employing a plurality of transceivers 302–304 and 306–308 in accordance with an embodiment of the present disclosure. The central office 300 comprises a plurality of equipment bays 301 and 305 that house the transceivers 302–304 and 306–308, respectively.

Each transceiver 302–304 is communicatively coupled to various customer premise equipment (CPE) (not shown) via a respective subscriber line 312, and each transceiver 306–308 is communicatively coupled to various CO equipment (not shown) via a respective central office connection 311. The central office 300 further comprises a digital cross-connect system (DCS) 309 that is communicatively coupled to each of the transceivers 302–304 and 306–308 via communication lines 320.

In operation, one of the transceivers 302–304 may receive a signal via its corresponding subscriber line 312. The receiving transceiver 302–304 transmits the received signal to the DCS 309. The DCS 309 maps the received signal to the appropriate central office transceiver 306–308 such that the appropriate CO equipment (not shown) receives the signal via a corresponding central office connection 311.

Furthermore, one of the transceivers 306–308 may receive a signal via its corresponding central office connection 311. This transceiver 306–308 transmits the signal to the DCS 309. The DCS 309 maps this signal to the appropriate transceiver 302–304 such that the signal is received by the appropriate CPE (not shown) via its corresponding subscriber line 312. The configuration of the central office 300 including the equipment bays 301 and 305 and corresponding transceivers 302–304 and 306–308, respectively, is an exemplary configuration for illustrative purposes only, and other configurations of the various components in other embodiments are possible.

When the exemplary transceivers 302–304 or 306–308 of the present disclosure are compliant with a particular specification, e.g., DS3 specifications, each transceiver 302–304 and 306–308 transmits a compliant pulse across the communication lines 320, in response to the digital input, that conforms to the particular specifications at the transceiver and conforms to the specifications at the DCS 309. In this regard, a compliant pulse transmitted by any of the transceivers 302–304 and 306–308 complies with a prescribed pulse template, e.g., the DS3 pulse template illustrated in FIG. 1, at any point along a length of the communication line 320 from zero feet to at least four hundred and fifty feet.

As described hereinabove, however, one equipment bay 301 or 305 may be located relatively close to the DCS 309 as compared to another bay 301 or 305, and the compliant pulse transmitted from bay 301 or 305 located further from the DCS 309 might experience greater smearing before reaching the DCS 309.

If a transceiver 302–304 or 306–308 receives an isolated pulse, the transceiver generates a leading edge pulse that makes up a portion of the compliant pulse, and which is added to a main body pulse and a trailing edge pulse such that the sequential combination of the leading edge pulse, the main body pulse, and the trailing edge pulse creates the compliant pulse. Each of these pulses is described in more detail with reference to FIG. 4.

Thus, when the compliant pulse is transmitted by the transceiver and received by the DCS 309 (or at any test point along the communication line 320), the compliant pulse complies with the corresponding template, e.g., the DS3 template illustrated in FIG. 1, even after the compliant pulse has been attenuated and smeared as a result of traveling across a communication line 320 to the DCS 309. More specifically, the front porch of the compliant pulse fits within the pulse mask template at both zero feet and four hundred and fifty feet.

Figure 4:
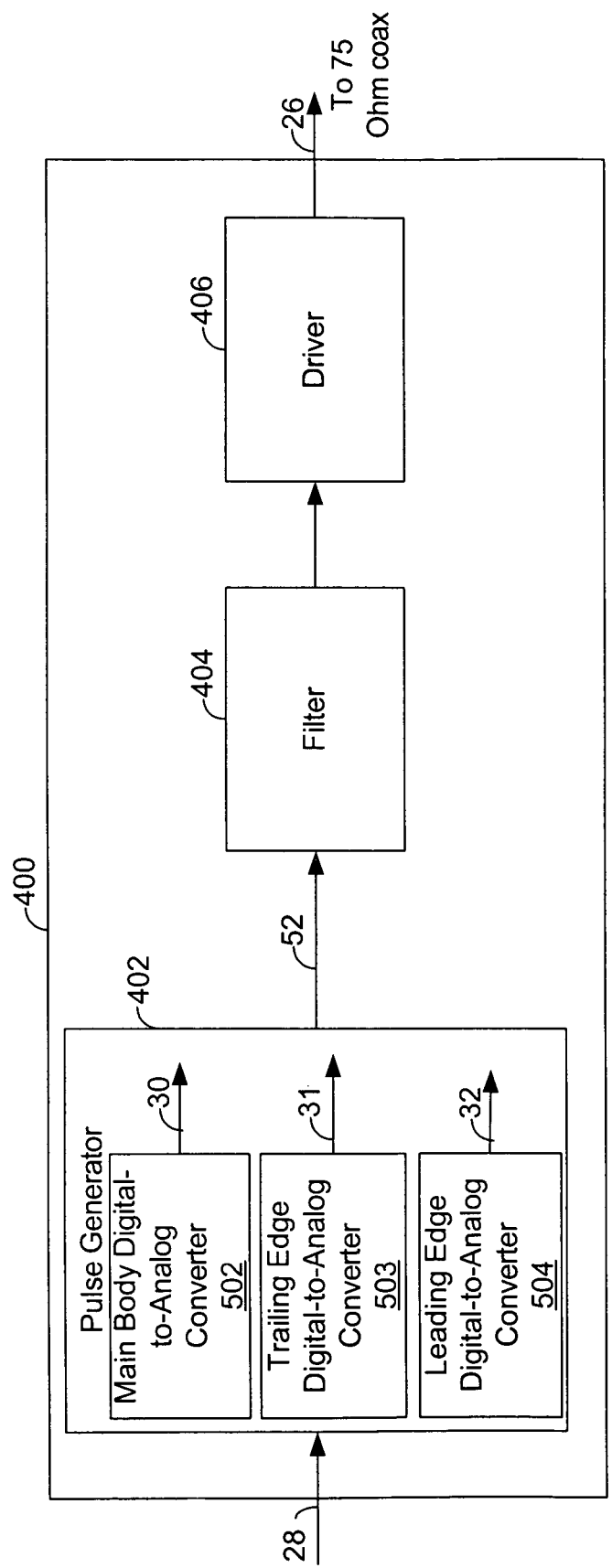
FIG. 4 is a block diagram illustrating an exemplary transceiver in accordance with one embodiment of the present disclosure.

FIG. 4 is a block diagram depicting a transceiver 400 in accordance with an exemplary embodiment of the present disclosure. The transceiver 400 of FIG. 4 comprises a pulse generator 402, a filter 404, and a driver 406. Note that the transceiver 400 of FIG. 4 may be used to implement any of the transceivers 302–304 and 306–308 of FIG. 3.

During normal operation, the pulse generator 402 receives digital data 28 over a connection. A DAC 502, referred to herein as the "main body digital-to-analog converter (DAC), converts the digital data 28 into analog signals, which are subsequently filtered by a filter 404 and driven by a driver 406 across a connection 320 (FIG. 3). In response to a digital test sequence in the data 28 representative of an isolated pulse, the generator 402 generates a pulse, hereinafter referred to as the "resultant pulse 52," representative of the digital data test sequence and transmits the resultant pulse 52 to the filter 404.

In this regard, in response to the digital test sequence, the main body DAC 502 generates a pulse, hereinafter referred to as the "main body pulse 30." Further, in response to the digital test sequence, a trailing edge DAC 503 generates a pulse, hereinafter referred to as the "trailing edge pulse 31," and a leading edge DAC 504 generates a pulse, hereinafter referred to as the "leading edge pulse 32." When pulses 30–32 are sequentially combined together, as will be described in more detail hereafter, their combination forms the resultant pulse 52.

The filter 404 smoothes the resultant pulse 52, and the driver 406 transmits the smoothed resultant pulse, hereinafter referred to as the "compliant pulse 26," to its next destination. For example, the transceiver 400 transmits the compliant pulse 26 over a communication line 320 (FIG. 3) to the DCS 309 (FIG. 3), which routes the compliant pulse 26 to another transceiver for transmission to its next destination.

During testing operations, test equipment (not shown) is connected to the transceiver 400. The test equipment generates digital data 28 representative of a test sequence, e.g., "0010." The pulse generator 402 receives the test sequence and transmits the test sequence to the main body DAC 502. Further, the pulse generator 402 transmits a predetermined 6-bit value defining the amplitude of the trailing edge pulse 31 to the trailing edge DAC 503 and a 6-bit value defining the amplitude of the leading edge pulse 32 to the leading edge DAC 504. The DACS 502–504 then generate the main body pulse 30, the trailing edge pulse 31, and the leading edge pulse 32 that are sequentially combined to form the resultant pulse 52, as will be described in more detail hereafter. This resultant pulse 52 is transmitted to the filter 404.

In this regard, the leading edge pulse 32 and trailing edge pulse 31 are generated such that the resultant pulse 52, after being filtered by filter 404 and driven by driver 406 to generate compliant pulse 26, meets its corresponding pulse mask template, e.g., DS3 template 100 of FIG. 1, at each test point along a connection 320 up to at least 450 feet. Particularly, the leading edge pulse 32 generated by the pulse generator 402 allows fine control of the front porch of the resultant pulse 52. Thus, when the compliant pulse 26 leaves the transmitter 400 and when the compliant pulse 26 reaches the DCS (FIG. 3) 309, the compliant pulse 26 complies with a corresponding pulse mask template, e.g., DS3 pulse template of FIG. 1 regardless of the length of the line, e.g., communication line 320 (FIG. 3), up to at least four hundred and fifty feet.

Notably, various types of communication standards may be used in different embodiments of the present disclosure. For example, the transceiver 400 may be configured to comply with DS3, STS-1, or E3 standards. When a particular standard is employed, the pulse mask template associated with that standard can be used to provide the relevant compliance bounds of the compliant pulse 26 that is to be transmitted by the transmitter 400. Thus, in determining the amplitude to be given for the leading edge pulse 32 that is to be generated in order to ensure compliance despite various possible cable lengths, the relevant template standard is used.

Figure 5:
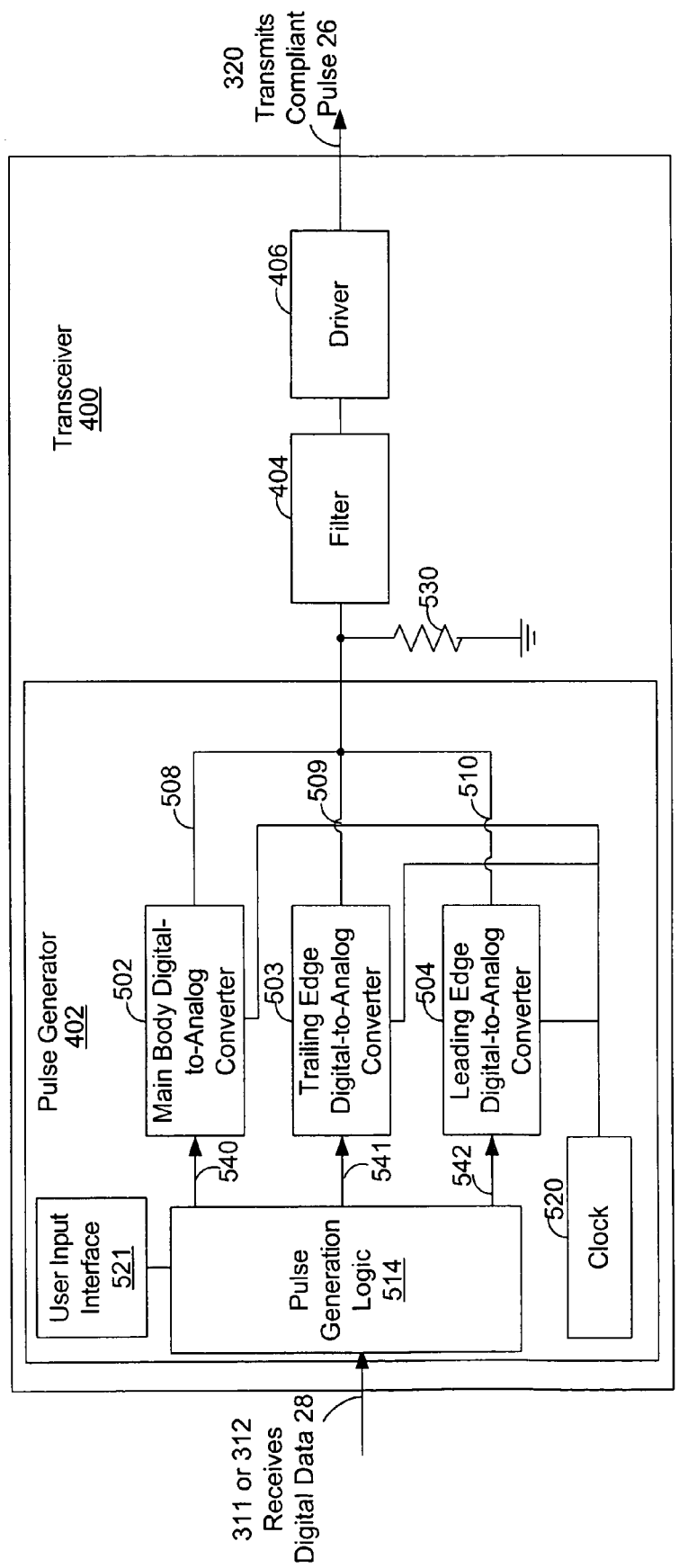
FIG. 5 is a block diagram illustrating an exemplary embodiment of the pulse generator depicted in FIG. 4.

FIG. 5 depicts a detailed block diagram of the transceiver 400 of FIG. 4. Specifically, the pulse generator 402 comprises pulse generation logic 514 communicatively coupled to the digital-to-analog converters 502–504. As described hereinabove, such DACs 502–504 include the main body DAC 502, the trailing edge DAC 503, and the leading edge DAC 504.

The pulse generator 402 is configured to generate the resultant pulse 52 (FIG. 4) based on a sequence of digital data received from connection 311 or 312, as described herein with reference to FIG. 4. The pulse generation logic 514 receives the digital data 28 (FIG. 4) from connection 311 or 312.

Note that, in one embodiment, the received digital data 28 (FIG. 4) is comprised of a pulse on/off bit and a sign bit that indicates positive or negative. Further note that DAC 502 is preferably a one-bit DAC, and DACs 503 and 504 are preferably 6-bit DACs. Therefore, the connection 540 between the pulse generation logic 514 and DAC 502 has a width of one bit, however, the connections 541 and 542 between the pulse generation logic 514 and each DAC 503 and 504, respectively, have a width of six bits. In other embodiments, other DAC and connection sizes are possible.

During operation, the pulse generation logic 514, except as otherwise described herein, is continuously sending each of the DACs 503 and 504 an offset binary six-bit zero, i.e., "100000." If the digital data 28 (FIG. 4) received does not indicate a pulse, the pulse generation logic 514 transmits the 6-bit digital representation of "zero," which is "100000" to DACs 503 and 504. Thus, the DACs 503 and 504 do not output any significant current.

In order to generate a compliant pulse 26, as described hereinabove, each DAC 502–504 is preferably configured to provide a pulse 30–32 (FIG. 4), and when the pulses 30–32 are sequentially combined, their combination is the resultant pulse 52. This resultant pulse 52 is provided to the filter 404. In this regard, logic 514 transmits to DAC 502 digital data representing the isolated pulse received in the test sequence. DAC 502 preferably converts this digital data 28 (FIG. 4) into the main body pulse 30 (FIG. 4). DAC 502 transmits the main body pulse 30 (FIG. 4) via connection 508. The main body pulse 30 (FIG. 4) has one-bit resolution, although other resolutions are possible in other embodiments.

Logic 514 transmits six bits to DAC 503 representing the amplitude of the trailing edge pulse 31 (FIG. 4) for defining the trailing edge of the resultant pulse 52. The value of the six bits depends on the pulse shape of the standard being transmitted, i.e. DS-3, STS-1, etc.

DAC 503 preferably converts these six bits into the trailing edge pulse 31 (FIG. 4). DAC 503 transmits the trailing edge pulse 31 (FIG. 4) via connection 509. In the instant embodiment, the trailing edge pulse 31 (FIG. 4) has six-bit resolution, as described hereinabove. Six bits of resolution enable substantially fine control over the amplitude of the trailing edge pulse 31 (FIG. 4) of the resultant pulse 52 (FIG. 4) and the compliant pulse 26 (FIG. 4). However, in other embodiments other resolutions are possible.

Together, the output of the DAC 502 and the DAC 503 define a portion of the resultant pulse 52 (FIG. 4). In particular, the output of the DAC 502 defines the main body pulse 30 (FIG. 4) contained in the resultant pulse 52 (FIG. 4), and the DAC 503 defines the trailing edge pulse 31 (FIG. 4) contained in the resultant pulse 52 (FIG. 4).

Additionally, when an isolated pulse is detected by the pulse generation logic 514, the logic 514 transmits a six-bit value to DAC 504. This six-bit digital value is predefined to ensure that for cable lengths of zero to at least 450 feet, a leading edge pulse 31 (FIG. 4) generated in response to a test sequence will cause the resultant pulse 52 after filtering and driving to conform to a requisite pulse mask template.

Upon receiving the foregoing six-bit value, the DAC 504 converts the six-bit value into the leading edge pulse 32 (FIG. 4) and transmits the leading edge pulse 32 (FIG. 4) via connection 510. In the instant embodiment, the leading edge pulse 32 (FIG. 4) has six-bit resolution. Six bits of resolution enable substantially fine control over the amplitude of the leading edge of the resultant pulse 52 (FIG. 4). In other embodiments, the leading edge pulse 32 may have other resolutions.

As an example, the designer or programmer preferably provides an input via the user input interface 521 that configures the pulse generator 402 such that the DAC 504 is programmed to transmit a compliant pulse 26 when placed into operation. In this regard, the six bits provided to DAC 504 can range from "000000," the lowest 6-bit value, to "111111," the highest 6-bit value. At "000000" the DAC 504 is negative and is sinking as much current as it can, and at "111111" the DAC 504 is fully positive and is sourcing as much current as it can. The six bits "100000" is the zero code that is right in the middle, and at "100000" the DAC 504 neither sources nor sinks.

In this regard, the cable lengths used during testing typically include cables varying from zero feet to 450 feet. In determining the value to which to set the six bits for controlling the leading edge pulse 32 (FIG. 4), the design engineer may increment or decrement the number provided by small intervals, test the transceiver 400 with the newly generated value, and change the value accordingly. In this regard, from the six-bit zero code, i.e., "100000," the engineer may subtract or add "3" from the zero code, which is "100000"+"000011," which equals "100011." Thus, the engineer or technician enters the "100011" into the user input interface, and the value is provided to the pulse generation logic 514. The pulse generation logic contains a circuit that calculates the inverse of these bits, in order to account for a negative pulse. The inverse of "100011" is the zero code minus "3." Thus, the inverse is "10000"–"000011," which equals "011101." If this value is then determined through to be the correct code to create a compliant pulse, then all transceivers are programmed with this standard value. Upon installation in a CO or other premises, the installer has no need to program the transceiver for the specific cable length because the transceiver is guaranteed to meet the pulse mask template for all cable lengths between zero and 450 feet.

Therefore, during operation, the pulse generation logic 514 might receive the following: +1, 0, 0, −1. In response, the pulse generation logic 514 would transmit to the leading edge DAC 504 "100000," "100000," "011101," and "100000." The tail of the positive pulse, +1, in the sequence may not have settled far enough to fit within the template. Therefore, the DAC 504 provides a leading edge pulse 32 (FIG. 4) having a negatively oriented amplitude of "011101" in order to ensure that the positive inter-symbol interference is prevented and the front porch of the compliant pulse 26 produced by the subsequent "−1" fits within the pulse template.

Further, the pulse generation logic 514 might receive the following: −1, 0, 0, +1. In response, the pulse generation logic 514 would transmit to the leading edge DAC 504 "100000," "100000," "100011," and "100000." The tail of the negative pulse, "−1," in the sequence may not have settled sufficiently to fit within the template. Therefore, the DAC 504 inserts a leading edge pulse 32 (FIG. 4) having a positively oriented amplitude of "100011" in order to ensure that the negative inter-symbol interference is prevented and the front porch of the compliant pulse 26 (FIG. 4) generated by the subsequent "+1" fits within the pulse template.

During the initial design process, the engineer might test the transceiver 400 with various leading edge amplitude values to determine the value to which to set the DAC 504 so that, regardless of the length of cable through which the compliant pulse 26 (FIG. 4) travels, it will continue to fall within the desired pulse template. As described hereinabove, the leading edge pulse 32 exhibits an amplitude that ensures that the pulse 26 complies with a prescribed pulse template.

During operation, the logic 514 is configured to determine whether preceding pulse is negative or positive. As illustrated hereinabove, if the pulse is positively oriented, then the logic 514 ensures that the leading edge pulse 32 (FIG. 4) is oriented negatively. Such negative orientation ensures that the leading edge pulse 32 (FIG. 4) prevents any inter-symbol interference as opposed to adding to it. Alternatively, if the pulse is negatively oriented, then the logic 514 ensures that the leading edge pulse 32 (FIG. 4) generated by DAC 504 is oriented positively, so that the leading edge pulse 32 prevents the inter-symbol interference.

Figure 6:
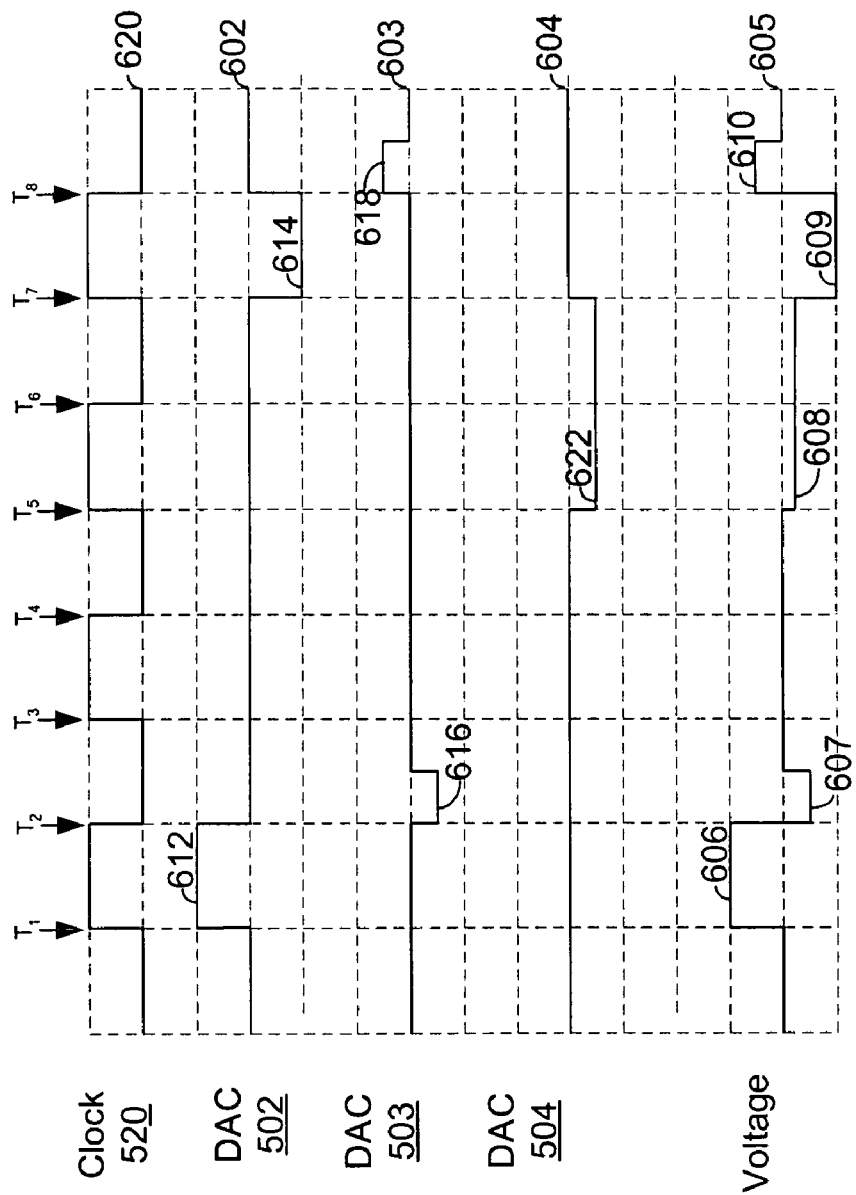
FIG. 6 is a timing diagram illustrating exemplary waveforms transmitted by the digital-to-analog converters of FIG. 5.

FIG. 6 illustrates exemplary waveforms transmitted by each DAC 502–504. The clock 520 (FIG. 5) outputs a clock signal, which is represented by the waveform 620. During testing operations, the pulse generation logic 514 of the pulse generator 402 (FIG. 3) receives digital data 28 (FIG. 4) representative of a test sequence from test equipment (not shown). The test sequence preferably comprises the digital data "+100–100."

In response to the test sequence, the pulse generation logic 514 initiates pulse shaping operations in order to ensure that compliant pulse 26 (FIG. 4) complies with a designated pulse mask template, for example, the DS3 pulse mask template 100 illustrated in FIG. 1. Exemplary pulse shaping operations will now be described hereafter.

The pulse generation logic 514 (FIG. 5) transmits digital data 28 (FIG. 4), the test sequence, defining an isolated pulse to the main body DAC 502 (FIG. 5). In accordance with the clock cycle represented by waveform 620, the DAC 502 converts the received digital data into a current output depicted by a main body pulse 614 in waveform 602 illustrated in FIG. 6. The pulse 612 depicted in waveform 602 represents a previous positive pulse indicative of digital data received prior to the receipt of the test sequence by DAC 502. The output signal from DAC 502 may comprise a positive main body pulse 612 or a negative main body pulse 614 in accordance with the orientation of the digital data received by the DAC 502. Note that the pulse 614 is considered to be an isolated pulse because it is preceded by a 100 and that pulse 612 may or may not be isolated.

The pulse generation logic 514 (FIG. 5) generates a digital signal representative of the trailing edge of received digital data and transmits the generated digital data to the trailing edge DAC 503 (FIG. 5). In accordance with the clock cycle represented by the waveform 602, the DAC 503 converts the received digital signal into a current output depicted by the trailing edge pulse waveform 603 illustrated in FIG. 6. As shown by waveform 603, the output signal from DAC 503 may comprise a negative pulse 616 or a positive pulse 618 depending on the orientation of the main body pulse 612 or 614 to which it is sequentially combined. Further note that the trailing edge pulses 616 or 618 may be transmitted in response to any digital data received, i.e., for the pulse 612, or for the digital data representative of the test sequence, i.e., for the pulse 614.

Note that, in response to the test sequence received, DAC 503 transmits the positive pulse 618 at a time $T_8$ in order to sequentially combine it with the negative main body pulse 614. The DAC 502 also transmits the negative pulse 616 at a time $T_2$ to sequentially combine it with the positive main body pulse 612. Thus, by exercising control over the trailing edge of the pulses 612 and 614, the logic 514 is able to better ensure that the pulse output by the transceiver in response to the digital test sequence complies with its associated pulse mask template.

As described herein, in the communication network 314 (FIG. 3), limited bandwidth and nonlinear group delay in the transmission medium can lead to smearing of signals being communicated. Such smearing manifests itself in the temporal spreading and consequent overlap of individual pulses to the degree that the receiver cannot reliably distinguish between changes of individual signal elements.

With respect to transmitting a pulse that complies with the front porch boundaries described with reference to FIG. 1, the described inter-symbol interference induced by the preceding pulse may result in the leading edge of the compliant pulse 26 (FIG. 4) output from the transceiver not complying with the front porch section 106 of the pulse mask template. In this regard, if the preceding pulse is a positive pulse, then residual positive energy from the preceding pulse may cause the leading edge of the pulse 26 (FIG. 4) to rise above the upper boundary 102 (FIG. 1) of the pulse mask template 100 (FIG. 1). If the preceding pulse is a negative pulse, then negative energy from the preceding pulse may cause the leading edge portion of the pulse 26 (FIG. 4) to fall below the lower boundary 104 (FIG. 1) of the pulse mask template 100.

Thus, to compensate for residual energy from a preceding pulse, the pulse generation logic 514 generates a leading edge pulse 32 that substantially cancels the positive energy or negative energy from the preceding pulse that might lead to the pulse 26 (FIG. 4) rising above or falling below the boundaries 102 and 104 of the template.

In the example in FIG. 6, a preceding positive pulse 612 may lead to positive inter-symbol interference on the line. Thus, the DAC 504 generates a leading edge pulse 622 negatively oriented in order to compensate for any positive energy from the pulse 612 remaining on the line. The logic 514 generates such a leading edge pulse 622 in order to exercise fine control over the leading edge of pulse 614 output from DAC.

Notably, the DAC 504 transmits the negative pulse 622 at time $T_5$ in order to sequentially combine it with the negative pulse 614. Thus, by exercising control over the leading edge of the negative pulse 614, the logic 514 ensures that the compliant pulse 26 generated in response to the test sequence complies with the front porch 106 of its associated pulse mask template.

As described herein, the output currents of each DAC 502–504 represented by the waveforms 602–604 are fed onto the resistor 530 (FIG. 5) located at the input to the filter 404 (FIG. 4). The resistor 430 inherently converts the output currents into a voltage. The resulting pulse 52 (FIG. 4) is represented as waveform 605 in FIG. 6.

The waveform 605 represents the voltage at the input of the filter 404 (FIG. 4). For example, waveform 605 at clock cycle $T_7$ comprises a negative main body pulse 609 corresponding to the main body pulse 614 transmitted by DAC 502. A positive trailing edge pulse 610 at $T_8$, which corresponds to pulse 618 transmitted by DAC 503, follows the pulse 609. Furthermore, waveform 605 comprises the leading edge negative pulse 608 corresponding to the negative leading edge pulse waveform 622 transmitted by the DAC 504 at $T_5$.

In another embodiment of the current invention, a single D/A converter having nine bits of resolution could create the same pulse shape. Such an embodiment may require greater linearity and may operate at four times the sample rate as the six-bit embodiment described hereinabove.

Figure 7:
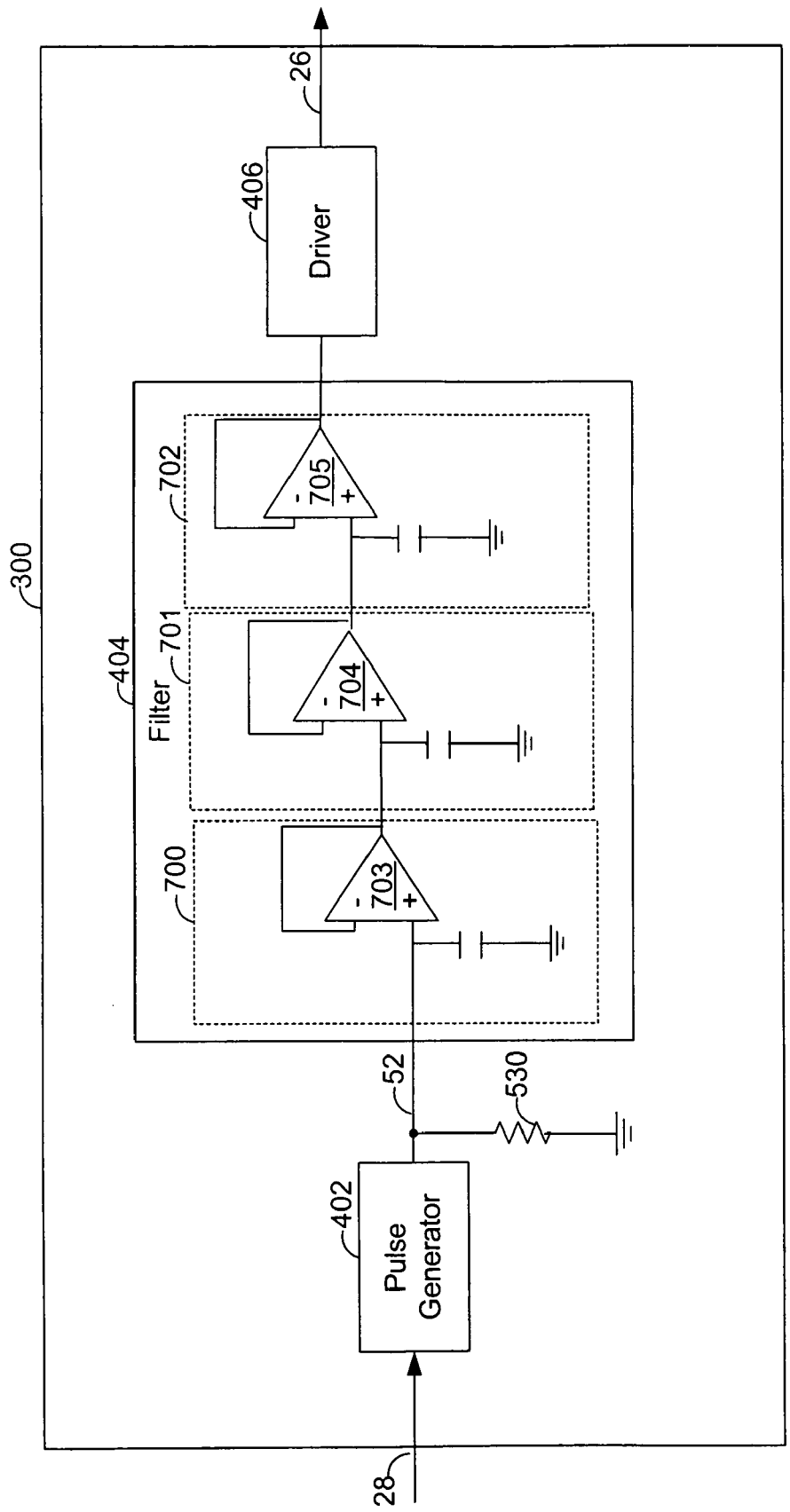
FIG. 7 is a block diagram illustrating an exemplary embodiment of the filter depicted in FIG. 5.

FIG. 7 depicts a detailed block diagram of the transceiver 400 of FIG. 4. Specifically, the exemplary filter 404 comprises a series of filter stages 700–702. Each filter stage 700–702 in the exemplary filter 404 of FIG. 7 is preferably identically configured. In this regard, each filter stage 700–702 comprises a low pass filter designed to eliminate high frequency components present in resultant pulse 52 received from the pulse generator 402.

Each exemplary filter stage 700–702 comprises a respective transconductance amplifier 703–705, as shown by FIG. 7. The first stage 700 receives the resultant pulse 52, which is a voltage signal representative of the concerted outputs of the DACs 502–504 (FIG. 5).

The first stage 700 eliminates a portion of the high frequency components in the resultant pulse 52 and transmits it to a subsequent stage 701 that repeats the high frequency component elimination, which then repeats the process again by transmitting the smoothed signal to the final stage 702. Thus, the compliant signal 26 is a substantially smooth analog signal that can be effectively transmitted and which retains the signal information and eliminates any unnecessary interference that high frequency signals might cause with other devices in the network.

Figure 8:
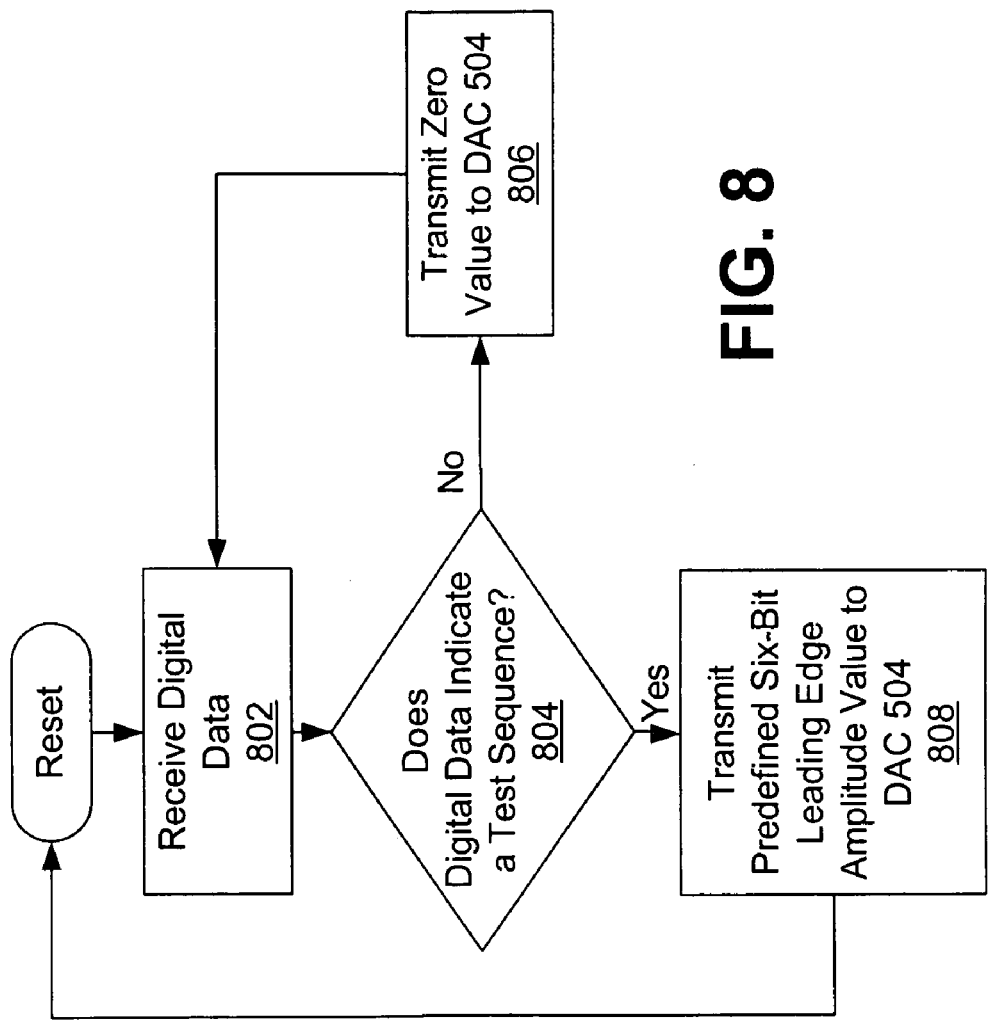
FIG. 8 is a flowchart illustrating an exemplary methodology for controlling a leading edge DAC of the pulse generator depicted in FIG. 5.

FIG. 8 is a flowchart illustrating an exemplary architecture and functionality of the pulse generation logic 514 of the present disclosure.

The logic 514 (FIG. 5) receives digital transmit data in step 802. The logic 514 continuously transmits the digital data to the DAC 502, which converts the digital data from digital to analog. If the logic 514 determines that the digital data received does not indicate an isolated pulse, e.g., if the data is not a digital sequence "1001," in step 804, the logic 514 transmits a "0" value to DAC 504 so that DAC 504 does not affect the output of DAC 502.

However, if the logic 514 determines that the digital data received indicates an isolated pulse, e.g., if the digital data is a digital sequence "1001," in step 804, then the logic 514 transmits the predefined six-bit leading edge amplitude value in step 808, as described hereinabove with reference to FIG. 5. DAC 504 converts this predefined digital value into the leading edge pulse 32 (FIG. 4) at a time such that the pulse 32 immediately precedes the main body pulse 30 that is generated by DAC 502 in response to the test sequence. The leading edge pulse 32 and the main body pulse 30 respectively define the leading edge and main body of the resultant pulse 52 (FIG. 4). Due to the insertion of the leading edge pulse 32 immediately prior to the main body pulse 30, the resultant pulse 52 represents a sequential combination of at least the main body pulse 30 and the leading edge pulse 32 that (FIG. 4) complies with the requisite pulse mask template, once it has been filtered and driven onto connection 320 to form the compliant pulse 26 shown in FIG. 4.

The invention claimed is:

1. A system for ensuring compliance with a specified pulse mask template, comprising:
   a first digital-to-analog (D/A) converter configured to receive a digital signal and to convert the digital signal into an analog pulse;
   a second D/A converter configured to cancel residual energy resulting from a previous pulse if a predetermined sequence of digital data is received;
   a third D/A converter configured to control a falling edge of the analog pulse; and
   logic configured to detect the sequence of digital data and to generate control data for at least one of the D/A converters from the digital data sequence thereby ensuring that the analog signal complies with the specified pulse mask template.

2. The system of claim 1, wherein the logic is configured to enable the second D/A converter in response to the detection of the sequence of digital data.

3. The system of claim 1, wherein the sequence of digital data comprises an isolated pulse.

4. The system of claim 1, further comprising a user-input interface, the user input interface configured to receive an input for defining a plurality of components of the analog pulse.

5. The system of claim 4, wherein the defined components comprise an amplitude component defining an amplitude of a current pulse from the second D/A converter, the amplitude component controlling the shape of a front edge of the analog pulse.

6. The system of claim 4, wherein the defined components comprise an amplitude of a current pulse from the third D/A converter for controlling a falling edge of the analog pulse.

7. The system of claim 4, wherein the defined components comprise an overall amplitude of the analog pulse.

8. A method for ensuring compliance with a specified pulse mask template, comprising the steps of:
   receiving a digital signal;
   converting the received digital signal into an analog signal, if the analog signal comprises an isolated pulse defined by a particular sequence of digital data in the digital signal, the isolated pulse having a main body portion and a leading edge portion;
   detecting the particular sequence of digital data;
   generating the main body portion in response to the particular sequence of digital data;
   generating the leading edge portion in response to the particular sequence of digital data separate from the step of generating the main body portion; and
   sequentially combining the main body and the leading edge portions.

9. The method of claim 8, wherein the combining step is in response to the step of detecting, the particular sequence of digital data.

10. The method of claim 9, wherein the generating step comprises the steps of:
    generating the main body portion via a first digital-to-analog converter; and
    generating the leading edge portion via a second digital-to-analog converter.

11. The method of claim 9, further comprising the step of receiving an input for defining an amplitude of the leading edge portion.

12. The method of claim 8, wherein the receiving step comprises the step of receiving the digital signal from a communication line having a length of zero feet and a communication line having a length of four hundred and fifty feet.

13. A transceiver, comprising:
    an input interface configured to receive a value indicative of an amplitude of a predefined pulse; and
    logic configured to sequentially combine the predefined pulse with an isolated pulse in response to a digital input sequence representative of the isolated pulse, the amplitude of the predefined pulse based on the value such that the isolated pulse complies with a specified pulse mask template.

14. The transceiver of claim 13, wherein the value is a six-bit digital value.

15. The transceiver of claim 13, further comprising a digital-to-analog converter configured to generate the predefined pulse.

16. The transceiver of claim 15, wherein the logic is configured to transmit the digital value to the digital-to-analog converter.

17. The transceiver of claim 16, further comprising a filter configured to filter the isolated pulse.

18. A system, comprising:
    a pulse generator configured to receive a sequence of digital data and to generate a compliant isolated pulse based on the sequence of digital data, the pulse generator having first, second and third digital-to-analog converters, the first digital-to-analog converter configured to define a main body portion of the isolated pulse, the second digital-to-analog converter configured to define a leading edge portion of the isolated pulse, and the third digital-to-analog converter configured to define a falling edge portion of the isolated pulse; and
    a filter configured to filter the isolated pulse.

* * * * *